United States Patent
Cox et al.

(10) Patent No.: US 7,072,025 B2
(45) Date of Patent: *Jul. 4, 2006

(54) LITHOGRAPHIC APPARATUS AND DEVICE MANUFACTURING METHOD

(75) Inventors: Henrikus Herman Marie Cox, Eindhoven (NL); Robertus Nicodemus Jacobus Van Ballegoij, Eindhoven (NL); Petrus Matthijs Henricus Vosters, Eindhoven (NL); Sven Antoin Johan Hol, Eindhoven (NL); Sebastiaan Maria Johannes Cornelissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/118,476

(22) Filed: May 2, 2005

(65) Prior Publication Data

US 2005/0190351 A1    Sep. 1, 2005

Related U.S. Application Data

(63) Continuation of application No. 10/454,839, filed on Jun. 5, 2003, now Pat. No. 6,906,786.

(30) Foreign Application Priority Data

Jun. 7, 2002    (EP) .................................. 02253970

(51) Int. Cl.
*G03B 27/42* (2006.01)
*G03B 27/58* (2006.01)
*G05B 5/01* (2006.01)

(52) U.S. Cl. ........................... 355/53; 355/72; 318/611; 318/623

(58) Field of Classification Search .................. 355/53, 355/72, 77; 310/12; 318/568.17, 592, 611, 318/623
See application file for complete search history.

(56) References Cited

U.S. PATENT DOCUMENTS

| | | | |
|---|---|---|---|
| 5,815,246 A | 9/1998 | Sperling et al. | |
| 5,844,666 A | 12/1998 | Van Engelen et al. | |
| 5,953,105 A | 9/1999 | Van Engelen et al. | |
| 6,262,796 B1 | 7/2001 | Loopstra et al. | |
| 6,449,030 B1 | 9/2002 | Kwan | |
| 6,906,786 B1 * | 6/2005 | Cox et al. | 355/53 |
| 2001/0006762 A1 | 7/2001 | Kwan et al. | |
| 2002/0012108 A1 | 1/2002 | Hara | |

FOREIGN PATENT DOCUMENTS

| | | |
|---|---|---|
| EP | 0 502 578 A1 | 9/1992 |
| EP | 1 111 470 A2 | 6/2001 |

* cited by examiner

*Primary Examiner*—Alan Mathews
(74) *Attorney, Agent, or Firm*—Pillsbury Winthrop Shaw Pittman, LLP

(57) ABSTRACT

A lithographic projection apparatus in which a reaction force is generated between a balance mass and a substrate table. The balance mass is elastically coupled to the base frame with a suspension eigenfrequency of between 0.3 and 10 Hz.

24 Claims, 10 Drawing Sheets

LITHOGRAPHIC APPARATUS AND DEVICE MANUFACTURING METHOD

CROSS REFERENCE TO RELATED APPLICATIONS

This application is a continuation of U.S. application Ser. No. 10/454,839, filed Jun. 5, 2003, now U.S. Pat. No. 6,906,786, which claimed priority to European Application 02253970.4, filed Jun. 7, 2002, the entire contents of both applications being incorporated herein by reference.

BACKGROUND OF THE INVENTION

1. Field of the Invention

The present invention relates to a lithographic projection apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types to direct, shape and/or control the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic projection apparatus, the information on a mask that is positioned on a support, is projected on the substrate table in a so-called scanning process, where the support and substrate table move synchronously at constant speed. The acceleration or deceleration forces can be high because the acceleration of the substrate table can typically be of the order of 5 to 100 m/s$^2$ and a substrate table might typically weigh about 10–200 Kg. If this substrate table is moved by an actuator that is attached to a base frame, the reaction force is transferred to this base frame. If this reaction force is directly transferred to the base frame, this results in large excitations of the base frame eigenfrequencies (typically 10 to 50 Hz). This results in base frame vibrations that disturb the vibration isolation system of the projection system. Part of the vibration can then be transmitted to the projection system. Because the substrate table is positioned relative to the projection system, this projection lens vibration will generate servo position errors, affecting the imaging process.

The effect of such a reaction force can be reduced by use of a freely mounted balance mass as described in U.S. Pat. No. 6,262,796. This is done by generating a reaction force using a positioning actuator between the substrate table and the balance mass such that the substrate table is moved in one direction while the balance mass is moved in the opposite direction by an amount equal to the distance moved by the substrate table times the mass ratio of the substrate table to the balance mass. In this way, no substantial reaction forces are transmitted to the base frame and the combined center of gravity of the balance mass and the substrate table relative to the base frame stays substantially constant.

If such a freely mounted balance mass has a large stroke, the balance mass requires guidance in its movement and the transmission of cables and tubes carrying utilities to the balance mass. In particular if the balance mass is in a vacuum, the guidance and transmission can be difficult to arrange and results in a large machine.

In an attempt to minimize the size of lithographic projection apparatus the mass of the balance mass can be increased to reduce the stroke required of the mass balance at the cost of extra complexity in the near frictionless support of the balance mass.

The above problems are equally applicable to the support for supporting the patterning device which also needs to move relative to the projection system and can be moved with the use of a balance mass.

SUMMARY OF THE INVENTION

It is an aspect of the present invention to provide an alternative to the freely mounted balance mass that at least partly eliminates one of the above mentioned problems. This and other aspects are achieved according to the invention in a lithographic apparatus including a radiation system configured to provide a beam of radiation; a support configured to support a patterning device, the patterning device being configured to pattern the beam of radiation according to a desired pattern; a substrate table configured to hold a substrate; a projection system configured to project the patterned beam onto a target portion of the substrate; a base frame; a balance mass; and an actuator configured to actuate a force between the substrate table or the support and the balance mass thereby to position the substrate table or the support, wherein the balance mass is coupled to the base frame via an elastic coupling so that the balance mass has a suspension eigenfrequency of between 0.3 and 10 Hz such that a portion of the reaction force is exerted on the base frame.

In this way, only part of the reaction force is transmitted to the base frame through the elastic coupling. An eigenfrequency of between 0.3 and 10 Hz of the balance mass is desired because then only low frequency vibrations are transmitted to the base frame as follows: reaction forces generated by movement of the substrate table or support at frequencies above about 10 to 15 Hz are hardly transmitted to the base frame as at these frequencies the balance mass is unaffected by the elastic coupling and behaves almost as a free balance mass for these frequencies. Unwanted disturbances of the substrate table or support typically are disturbances with frequencies well above 10 Hz but the balance mass does not transfer significant disturbances in this frequency region. However, acceleration forces generated by long stroke operations of the substrate table or support, which typically have an energy with a frequency of below 10 Hz, are transmitted to the base frame. Part of the reaction force on the balance mass is taken up by the spring stiffness of the elastic coupling and this requires a small stroke. It has been found that such low frequency forces transmitted to the base frame can be quite high in magnitude before they have a deleterious effect on the apparatus. In this way, in a typical lithographic projection apparatus according to the present invention the stroke of the balance mass is typically less than about 20 mm. The elastic coupling may, as an example, include leaf-springs, torsional springs or other mechanical springs, magnet assemblies with spring-like characteristics, etc. Furthermore, it is noted that, the elastic coupling has the tendency to move the balance mass to its neutral position. This yields, for example, advantages during initialization of the positioning actuator.

In an embodiment according to the present invention, the balance mass is further supported via a bearing to the base frame. The bearing can, as an example, be an air bearing between the base frame and the balance mass. This provides a support allowing the balance mass to make the required stroke in the translational direction.

In an embodiment according to the present invention, the apparatus is configured such that on movement during positioning of the substrate table or the support the position of the combined center of gravity of the substrate table or the support and the balance mass relative to the base frame also moves. Due to the elastic coupling of the balance mass to the base frame, the center of gravity will not maintain its position on movement during positioning of the substrate table or the support.

In an embodiment of the present invention, the apparatus further comprises a balance mass actuator for controlling the position of the balance mass. In this active embodiment, the balance mass actuator can be positioned in parallel with the elastic coupling, wherein the balance mass is also coupled to the base frame via the balance mass actuator. This balance mass actuator may be used to apply position correction forces to the balance mass at a low frequency. In this way, large but low frequency forces in the translational direction can be applied to the base frame at low frequency. The balance mass actuator may also enable a damping of the resonance frequency of the balance mass system (formed by the mass of the balance mass and the stiffness to base frame of the elastic coupling) and a further decrease in force transfer in the frequency range above 10 Hz between the base frame and the balance mass.

In an embodiment of the present invention, a filtered feed forward program is applied to the balance mass actuator to smooth out the forces passed to the base frame. The balance mass actuator may, for example be a pneumatic, hydraulic, electromagnetic or piezo-electric actuator.

In another embodiment of the present invention, the apparatus comprises a spring-damper system positioned in parallel with the elastic coupling, wherein the balance mass is also coupled to the base frame via the spring-damper system. The spring-damper system may combine different types of springs (mechanical, air, magnetic) with different types of dampers, for example, a viscous damper, an eddy current damper, etc. In order to obtain the required transfer characteristic both series and parallel connections of springs and dampers may be applied. The passive embodiment provides a less expensive solution and is generally more robust than an active solution at the expense of some performance.

The spring-damper system may include at least one element having the characteristics of a spring connected in series with at least one element having the characteristic of a damper. In an embodiment where the elastic coupling substantially has the characteristics of a spring, this system is further on referred to as the KDK-system. The damper could be implemented as a viscous damper or any other type of damper.

The damper may be implemented as an Eddy current damper, since this provides endurance, reliability, maintainability and contamination. This KDK-system enables a damping of the resonance frequency of the balance mass system (formed by the mass of the balance mass and the stiffness to base frame of the elastic coupling) and a further decrease in force transfer in the frequency range above 10 Hz between the base frame and the balance mass. The spring damper system may also be realized by applying components that incorporate both characteristics of a spring and a damper such as rubber like materials or memory alloys.

In an embodiment of the present invention, the balance mass is damped with a damper with a damping coefficient b of between 0.3 and 0.9, for example between 0.65 to 0.75. In this way long stroke reaction forces of the substrate table applied to the base frame cannot amplify.

In an embodiment of the present invention, the damper is positioned in parallel with the elastic coupling, wherein the balance mass is also coupled to the base frame via the damper. The damping may be realized by a separate component or can be obtained by the elastic coupling itself with internal damper.

In an embodiment of the present invention, the balance mass is damped with a damping coefficient b which is varied as a function of frequency. As an example, an Eddy current damper may be applied. Also, in case a balance mass actuator is used for actively damping vibrations of the balance mass the damping coefficient can be varied as a function of frequency.

In an embodiment of the present invention, the apparatus further comprises a controller for periodically applying a position control loop. This may, as an example be applied to prevent drift of the balance mass due to repetitive motions of the substrate table or support or to compensate for friction of the balance mass or to correct hysteresis effects of the elastic coupling.

In an embodiment of the present invention, between 50 and 100% of the reaction force with a frequency below 3 to 10 Hz is exerted by the elastic coupling on the base frame.

In an embodiment of the present invention, the apparatus further comprises a vacuum chamber containing the substrate table or support and the balance mass. The balance mass of the present invention is particularly suited to such applications because of its small stroke.

In an embodiment of the present invention, a bellows is applied between the balance mass and a wall of the vacuum chamber. This is possible because of the small stroke of the balance mass and is advantageous because any cables and tubes to provide utilities to the balance mass, for example, such as air for air bearings or electrical cables for positional sensors, can be routed through the bellows and do not therefore need to be vacuum compliant.

In an embodiment of the present invention the bellows form at least part of the elastic coupling. Depending on the stiffness, the bellows may partly or completely take over the function of the elastic coupling between the balance mass and the base frame.

In an embodiment of the present invention, the balance mass actuator or the spring-damper system is connected with the balance mass through the bellows. According to a further aspect of the invention there is provided a device manufacturing method including providing a substrate that is at least partially covered by a layer of radiation-sensitive material on a substrate table positioned on a base frame; providing a beam of radiation using a radiation system; using a patterning device supported on a support to endow the beam of radiation with a pattern in its cross-section; projecting the patterned beam of radiation onto a target portion of the layer of radiation-sensitive material; moving the substrate table or the support relative to the base frame by generating a reaction force between the substrate table or the support and a balance mass, and in transmitting part of the reaction force to the base frame through an elastic coupling which couples the balance mass to the base frame with a suspension eigenfrequency of between 0.3 and 10 Hz.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die"

in this text should be considered as being replaced by the more general terms "mask", "substrate" and "target portion", respectively.

BRIEF DESCRIPTION OF THE DRAWINGS

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

Embodiments of the invention will now be described, by way of example only, with reference to the accompanying schematic drawings in which.

In the Figures, corresponding reference symbols indicate corresponding parts.

DETAILED DESCRIPTION

Figure 1:
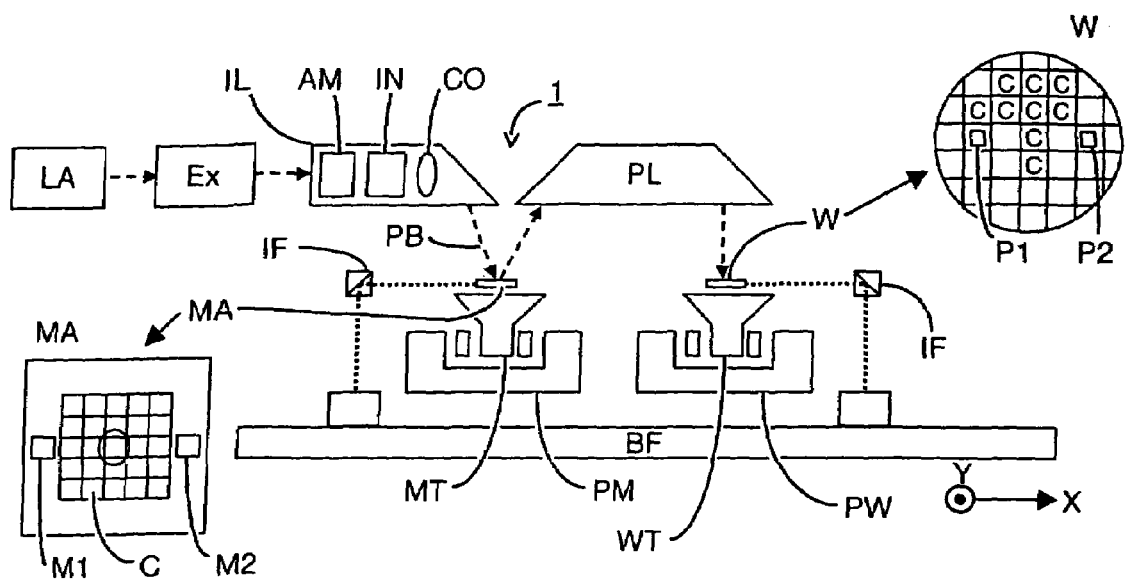
FIG. 1 depicts the relevant parts of a lithographic projection apparatus.

FIG. 1 schematically depicts a lithographic projection apparatus 1 according to an embodiment of the present invention. The apparatus 1 includes a base frame BF; a radiation system Ex, IL configured to supply a beam of radiation PB of radiation (e.g. EUV radiation), which in this particular case also comprises a radiation source LA; a first object (mask) table MT provided with a mask holder configured to hold a mask MA (e.g. a reticle), and connected to a first positioning device PM that accurately positions the mask with respect to a projection system or lens PL; a second object (substrate) table WT provided with a substrate holder configured to hold a substrate W (e.g. a resist-coated silicon wafer), and connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The invention will be described with reference to the substrate table WT. However, the invention is equally applicable to the mask table MT.

As can be seen from FIG. 1 a typical lithographic apparatus comprises a base frame BF on which the various components are supported.

Figure 2:
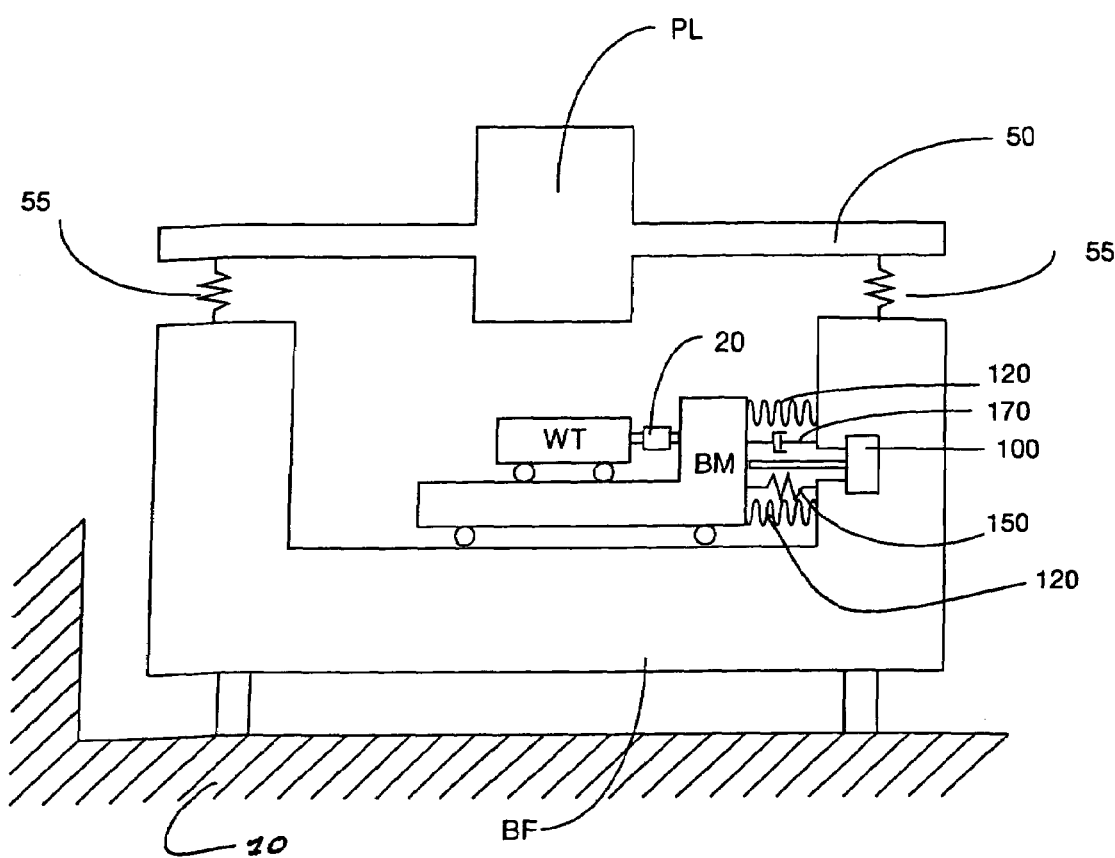
FIG. 2 depicts a lithographic projection apparatus according to an embodiment of the invention.

As an example, the mounting of the various components to the base frame is illustrated schematically in FIG. 2. This figure shows the base frame BF which is stiffly connected to the ground 10. The projection system PL is isolated from vibrations of the base frame BF by being mounted on a metrology frame 50 which is compliantly connected to the base frame BF with a soft suspension system 55 of an active vibration isolation system (AVIS). The wafer table WT is driven by an actuator 20 and the reaction force is set on the balance mass BM. An elastic coupling 150 is connected between the balance mass BM and the base frame BF. The stiffness of the elastic coupling 150 is chosen such that the balance mass BM is mounted on the base frame BF with a suspension eigenfrequency in the translational (horizontal) plane of between 0.3 and 10 Hz, for example, 1 to 6 Hz. A suitable suspension eigenfrequency is about 3 Hz.

The suspension eigenfrequency $f_0$ can be calculated according to equation (1):

$$f_0 = \frac{1}{2\pi}\sqrt{\frac{k_{spring}}{m_{BM}}}, \quad (1)$$

wherein $k_{spring}$ is the stiffness of the spring of the elastic coupling 150 and $m_{BM}$ is the mass of the balance mass BM. Arranging for the suspension eigenfrequency of the balance mass to be in the range of 0.3 to 10 Hz ensures that a large but low frequency force dump into the base frame BF from the balance mass BM is allowed in both directions in the translational horizontal plane (forces of up to about 5000 N at a frequency of less than 3 Hz). In this example, in parallel with the elastic coupling 150, a damper 170 and a balance mass actuator 100 are placed. The elastic coupling 150, the damper 170 and the balance mass actuator 100 may optionally be enclosed by a bellows 120. In this way, the elastic coupling 150, the damper 170 and the balance mass actuator 100 are sealed off from the compartment wherein the substrate table WT and the balance mass BM are located. The use of bellows may impose less stringent conditions on the elastic coupling 150, the damper 170 and the balance mass actuator 100 with respect to contamination or outgassing properties, etc.

The balance mass actuator 100 is used to correct the position of the balance mass BM which can have a tendency to drift from the correct position. This drift, which can be thought of as hysterisis, can be as a result of friction between the base frame BF and the balance mass BM, for example. The correction is applied as a closed loop control by having a controller which controls the balance mass actuator 100 and periodically (for example every millisecond) applies a force, if necessary, to center the balance mass BM substantially to prevent drift of the balance mass resulting from repetitive motions of the substrate table.

The actuator 100 may also be used to damp movement of the balance mass BM to avoid windup, i.e. resonance of the balance mass BM. Alternatively, this function may be performed by the separate mechanical passive damper 170.

Whatever form of damping is used, the relative damping coefficient b may be between 0.5 and 1.0, for example between 0.65 to 0.75. If the balance mass actuator 100 is used, it may be used as an active damper, the damping coefficient b being varied as a function of frequency. For example, a damping coefficient of b=0.7 may be used up to a threshold frequency of, for example, in the region of 0.3 to 20 Hz after which the damping coefficient reduces such that at a frequency of infinity, the damping coefficient is zero. In this way, the force transfer from balance mass BM to base frame BF at high frequencies is less than that for the case where the damping coefficient is constant. This damping also reduces the amplitude of the force transfer from balance mass BM to base frame BF for frequencies of movement of the substrate table WT close to the suspension eigenfrequency of the balance mass BM.

The balance mass actuator 100 may also be used to smooth the force profile transmitted at low frequencies to the base frame using a filtered feed forward program. This is done by passing the expected reaction force of the balance mass BM on the base frame BF through a low pass filter and applying a force through the balance mass actuator 100 to the balance mass BM which smoothes out the sharp changes in reaction force. High frequency disturbances are not passed to the base frame BF in any case.

Figure 3:
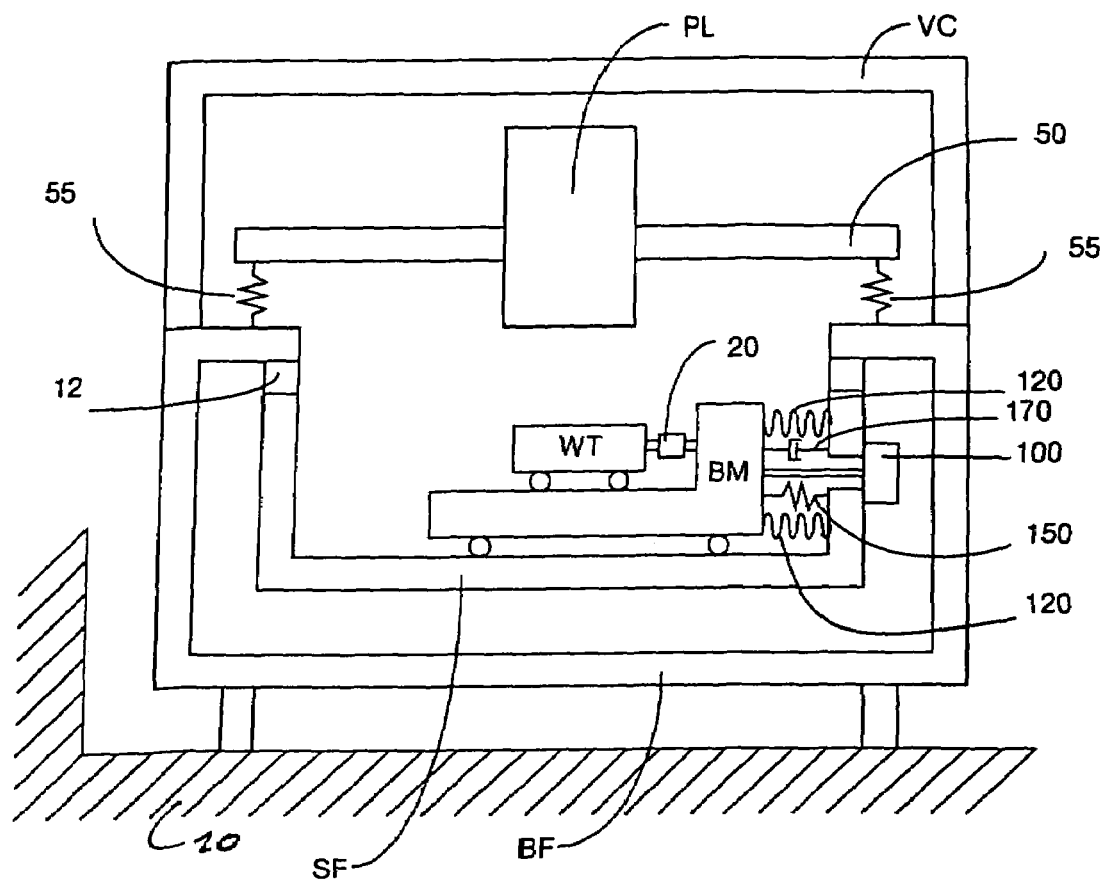
FIG. 3 depicts a lithographic projection apparatus according to an embodiment of the invention suitable for vacuum applications.

FIG. 3 shows an alternative arrangement of the various components supported by the base frame BF for use in vacuum applications. In this example, the substrate table WT is positioned on a substrate table support frame SF (which is stiffly connected to the base frame BF) via a connector 12. The wafer table WT is driven by an actuator 20 and the reaction force is set on the balance mass BM. An elastic coupling 150 parallel with a balance mass actuator 100 and a damper 170 are connected between the balance mass BM and the substrate table support frame SF. In this embodiment, the projection system PL, balance mass BM and substrate table WT are enclosed by a vacuum chamber VC that is stiffly connected to the base frame BM.

Both the substrate table WT and balance mass BM are mounted such that translational movement in the horizontal plane parallel to the surface of the substrate table support frame SF is substantially frictionless. This can be achieved, for example, by suspending the substrate table WT from the balance mass BM and providing the balance mass BM with air bearings or providing both the substrate table WT and the balance mass BM with air bearings such that their weight can be supported by the substrate table support frame SF. The balance mass BM may also be suspended on elastic mechanical or pneumatic springs.

On actuation of the positioning actuator 20 to generate a reaction force, the substrate table WT and balance mass BM will translate in opposite directions.

The balance mass BM is elastically coupled to the substrate table support frame SF and thereby to the base frame BF with an elastic coupling 150. The stiffness of the elastic coupling 150 is chosen such that the balance mass BM is mounted on the wafer stage support frame SF with a suspension eigenfrequency in the translational (horizontal) plane of between 0.3 and 10 Hz, for example between 1 to 6 Hz. A suitable suspension eigenfrequency is about 3 Hz.

Figure 4:
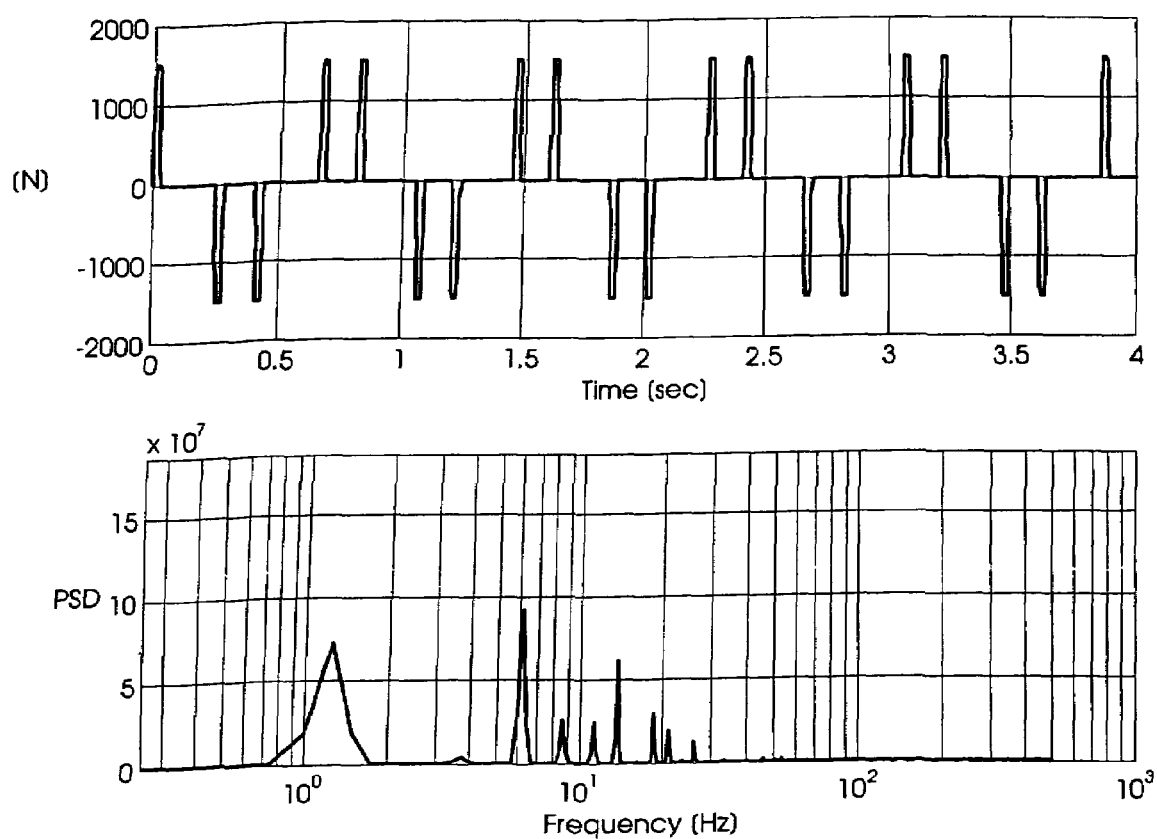
FIG. 4 depicts a typical force pattern during the scanning process in both time and frequency domain.

FIG. 4 shows the acceleration and deceleration forces that typically occur during the scanning process. Acceleration and deceleration forces are shown both in the time domain and in the frequency domain. In this example, the maximal acceleration force is about 1500 N. Also the power spectrum or the energy per frequency band is shown. Typically the acceleration profile Power Spectrum shows large forces at frequencies below 20 Hz. Above this frequency the remaining energy is very small.

Applying a suspension eigenfrequency in the range of 0.3 to 10 Hz for the balance mass, short stroke translational movements of the substrate table WT, which occur at frequency of about 10–15 Hz and above, are hardly transferred to the base frame as the balance mass BM acts here in a conventional free mass manner. However, for long stroke translational movements of the substrate table WT, which occur at a low frequency of below about 15 Hz, at least a part of the reaction force is transferred to the substrate table support frame SF and thereby to the base frame BF. Thus, the displacement required of the balance mass for low frequency movements is reduced as a portion of the reaction force (between 50 and 100%) is exerted on the substrate table support frame SF via the elastic coupling 150. It has been found that such large but low frequency force dumps in the horizontal translational direction can be applied to the base frame BF (typically about 1000–5000 N at frequencies of less than 3 Hz) without deleterious effects to the performance of the apparatus.

Figure 5:
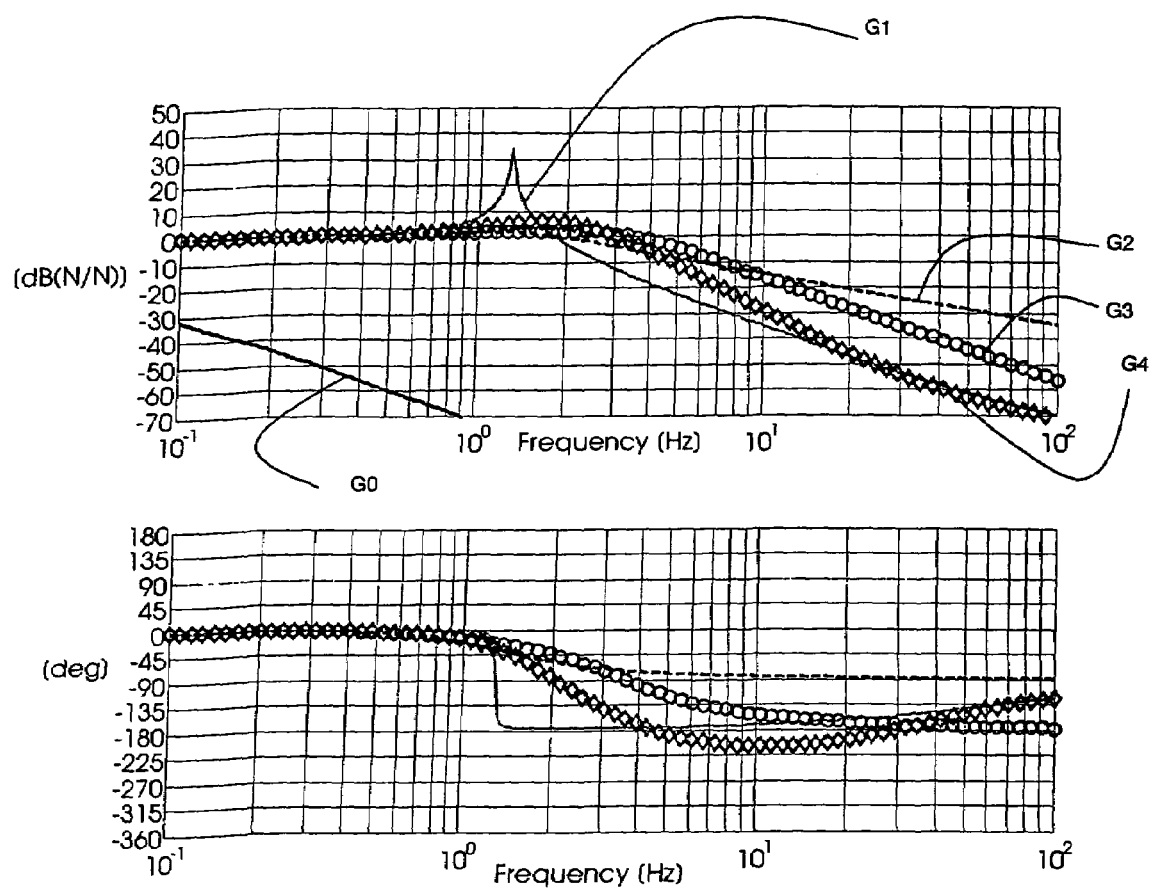
FIG. 5 depicts the transfer of the reaction force to the base frame in the frequency domain for different embodiments of the present invention.

FIG. 5 shows the Bode plots of transfer of balance mass forces to the base frame for a number of embodiments of the present invention. This figure shows the balance mass force to base frame force ratio (in dB) vs. the frequency (in Hz). As a reference, the characteristic of a freely mounted balance mass (i.e a Newton balance mass) is shown as graph G0. A perfect balance mass that operates according to Newton's 'action=reaction' law, will absorb all energy and thus cannot transmit forces to the base frame. A less perfect Newton balance mass will partly transmit a very small amount of force with low frequencies. A Newton balance mass has the disadvantage that the motion or excursion is equal to the mass ratio of balance mass and substrate table.

If an elastic coupling is connected between the balance mass BM and the base frame BF, the balance mass excursion can be much reduced. The effect, however, is that low frequency forces are directly transmitted (to the base frame) and that at the resonance frequency the base frame force can be much higher than the balance mass force, as is shown in graph G1. Above the resonance frequency, the undamped balance mass again reduces the force dump into the base frame and forms a mechanical filter with a roll-off of −40 dB/dec. The amplification at the resonance frequency is reduced by applying a passive damper in parallel with the elastic coupling between the Balance mass and the Base Frame as shown in graph G3. However the mechanical filter of this damped balance mass then only has a roll-off of −20 [dB/dec].

When the damping element is formed by a damper in series with a spring, this combined system of elastic coupling and spring-damper system, also referred to as the KDK-system, again has a roll-off of −40 [dB/dec], although the filtering starts at a higher frequency. As is shown in graph G3, the performance of this KDK-system balance mass is superior to the damped balance mass shown in G2.

In an other embodiment, a control loop formed by an actuator between the balance mass and base frame and a position sensor that measures the position of the balance mass relative to the base frame is applied. The controller can be adjusted in such a way that both the damping of the resonance frequency is obtained and the steep, −40 dB roll off, is maintained. See graph G4.

Figure 6:
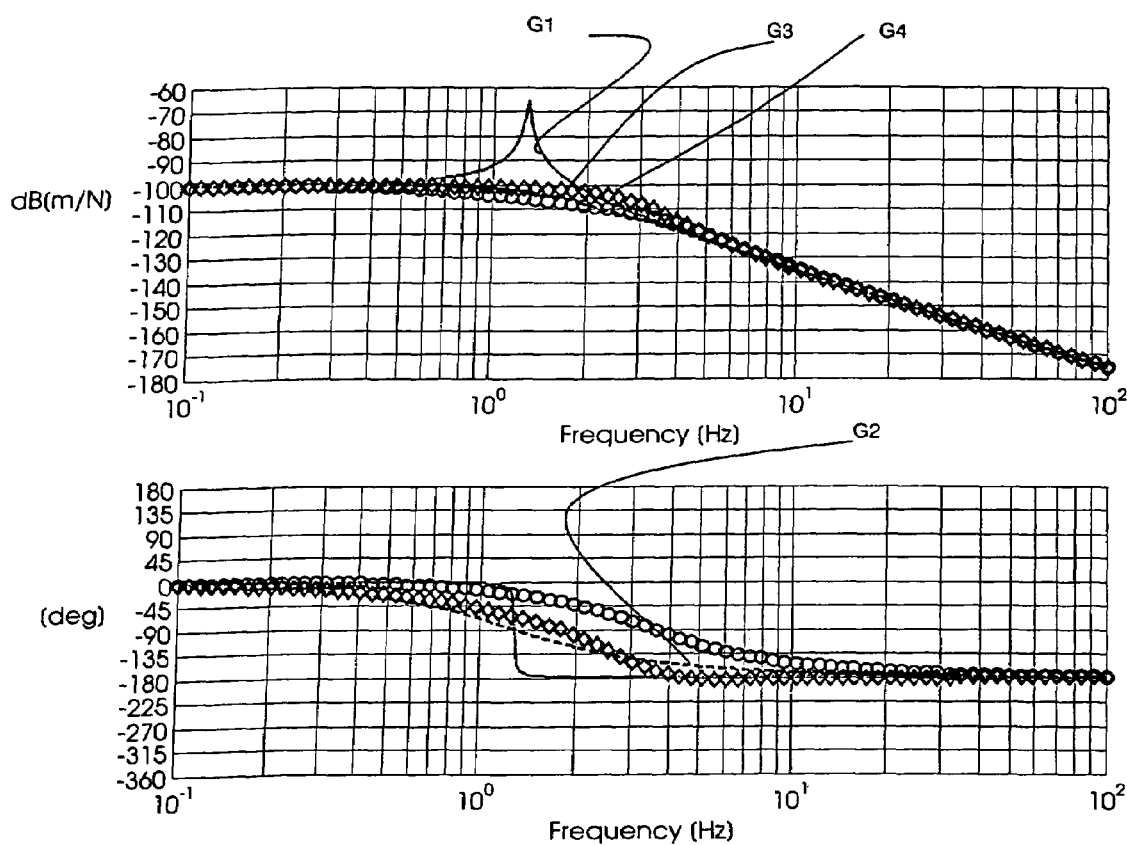
FIG. 6 depicts the transfer function of the balance mass displacement to the base frame force in the frequency domain for different embodiments of the present invention.

FIG. 6 depicts the Bode plots of the transfer of the balance mass motion to the reaction force. At low frequencies, the balance mass motion as function of the input force is proportional to the inverse of the stiffness of the elastic coupling. So a stiffness of $1 \times 10^{-5}$ N/m between balance mass and base frame will result in $1 \times 10^{-5}$ m displacement per 1 N input force (so the transfer is $1 \times 10^{-5}$ m/N or −100 dB). For 1500 N the displacement is about 15 mm. If the stiffness is increased, the motion is reduced by the same factor, but also the frequency band for the output forces is increased (see FIG. 6 and eq. 1). So a soft elastic coupling comes with soft forces (strong balance mass filtering) but also a large excursion. A stiff elastic coupling has hard forces (poor filtering) but a small excursion. Somehow a suitable compromise between balance mass excursion and force filtering performance can be found. The use of an elastic coupling that has a non-linear characteristic may be applied to accommodate this compromise. Both linear and non-linear springs-type elements may be applied to realize this. These elements can be arranged between balance mass and base frame in such manner that the stiffness progressively increases when the balance mass is displaced from its neutral position.

Near the resonance frequency, the displacement will be amplified if no damping is present (the amplification shown in FIG. 6 is approximately 100 times greater). In order to avoid this, a damping element should be combined with the elastic coupling. Graph G1 in FIG. 6 shows the characteristics of the undamped system, G2 shows the characteristics of the damped system, G3 shows the characteristics of the KDK-system and G4 shows the characteristics of the elastic coupling combined with the balance mass actuator. In the damped systems (G2,G3,G4), the amplification occurring in the undamped system at the resonance frequency is attenuated. For high frequencies all systems have a −40 dB/dec roll off, so forces with very high frequency can only generate small Balance mass displacements.

Figure 7:
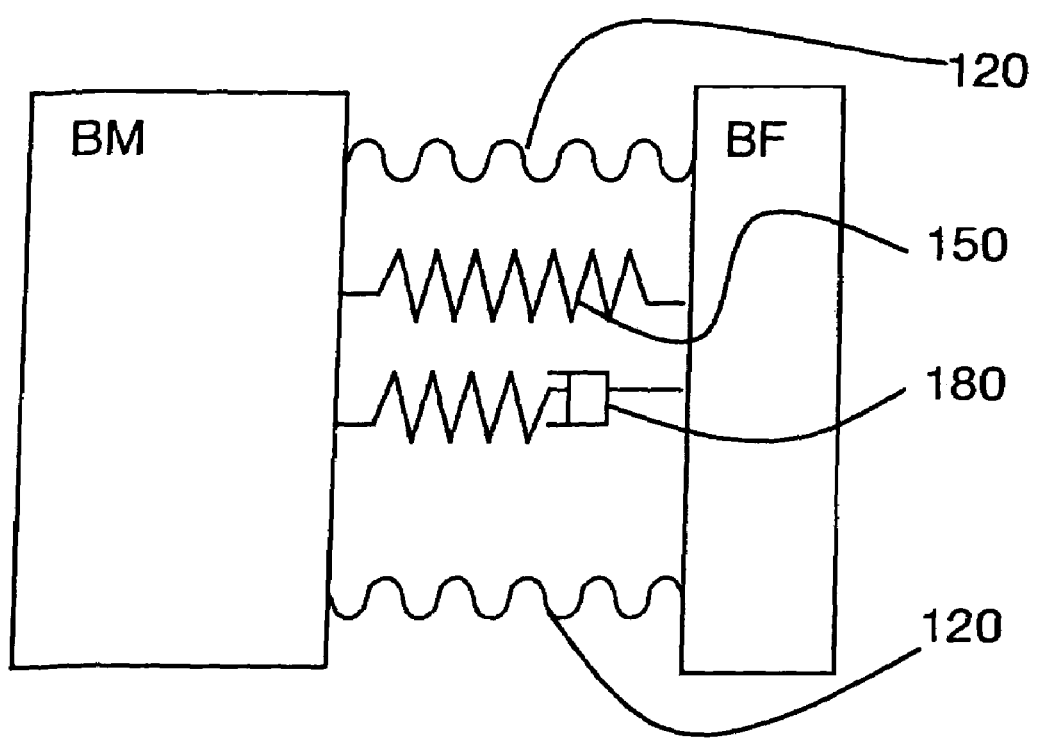
FIG. 7 depicts the KDK-system connecting the base frame an the balance mass according to an embodiment of the present invention.

FIG. 7 schematically depicts an embodiment of the present invention, wherein the KDK-system is applied between the balance mass and the base frame. The KDK-system is a passive system that comprises an elastic coupling 150 in parallel with a spring-damper system 180 that comprises an element having the characteristics of a spring in series with an element having the characteristics of a damper. This KDK-system can be applied in combination with a bellows 120 enclosing the KDK-system enabling the use of materials or components that are not vacuum-compliant for the KDK-system. The bellows may also take over, partly or completely, the function of the elastic coupling 150. The KDK-system as shown in figure can also be applied inside an embodiment as shown in FIG. 3, as an alternative to elastic coupling combined with a balance mass actuator.

In a vacuum application, the balance mass BM is connected to the wall of the vacuum chamber VC by metal bellows 120 which may be manufactured from welding a curved plate or buckling a wide pipe with thin walls. The bellows allow the elastic coupling 150 and the actuator 100 or the KDK-system to be placed outside of the vacuum chamber VC such that their design requirements are less stringent as they do not need to be vacuum compliant (for example meet out-gassing criteria). Furthermore, utilities can be provided to the balance mass BM through the bellows 120 via pipes or cables. The use of bellows 120 is possible because of the small stroke which the balance mass BM undergoes during positioning of the substrate table WT. The bellows may form at least part of the elastic coupling of the balance mass BM to the base frame.

Figure 8:
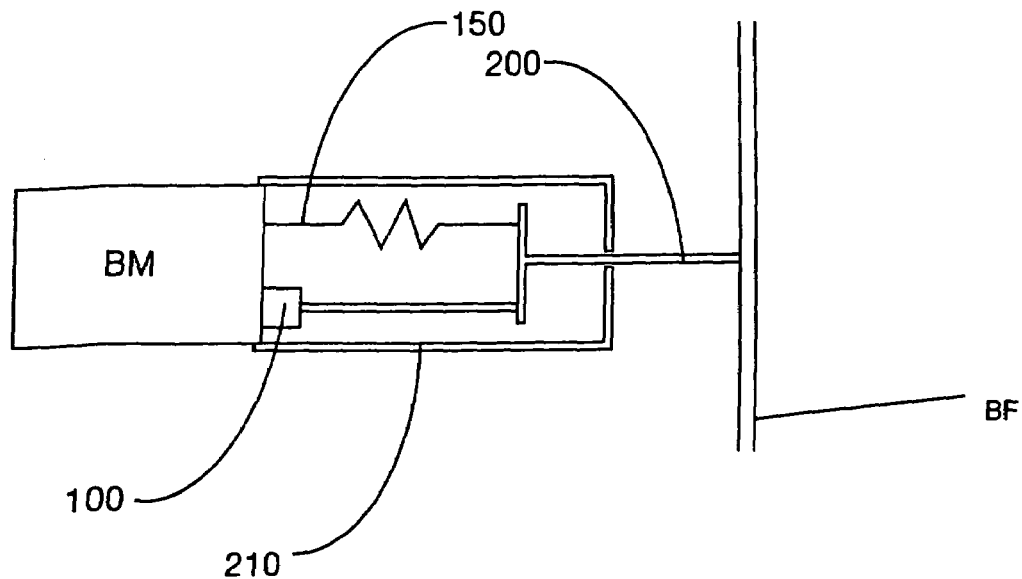
FIG. 8 depicts an alternative arrangement for connection of the balance mass to the base frame according to an embodiment of the invention.
Figure 9:
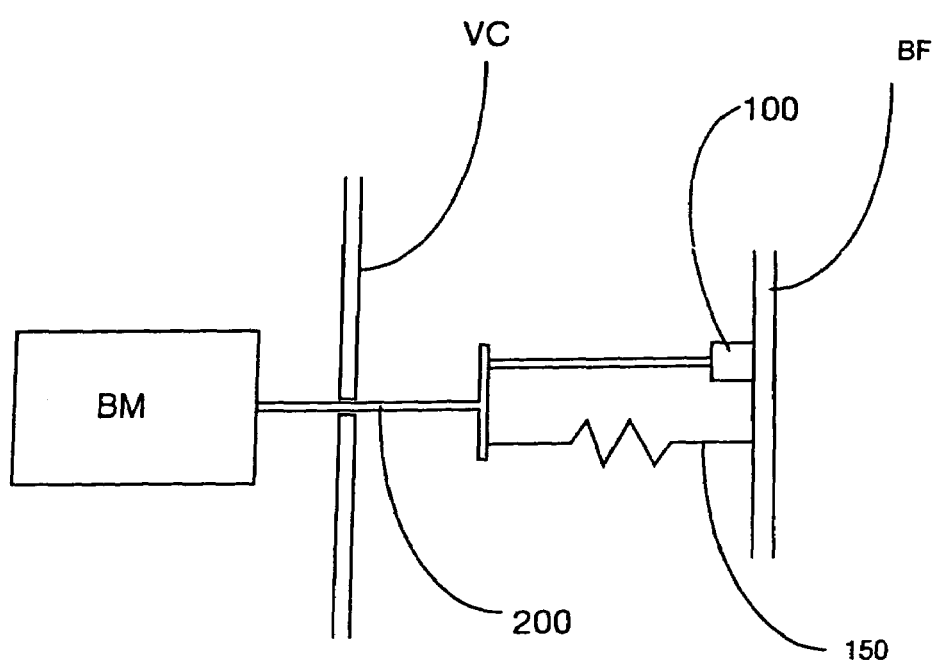
FIG. 9 depicts an other alternative arrangement for connection of the balance mass to the base frame according to an embodiment of the invention.

FIG. 8 shows an alternative layout for the connection of the balance mass BM to the base frame BF which, in this embodiment, is part of the vacuum chamber VC. The elastic coupling 150 and balance mass actuator 100 are housed in the substrate table vacuum chamber within a secondary vacuum chamber 210 which may be at higher pressure than the vacuum chamber VC. A connection member 200 connects the elastic coupling 150 and balance mass actuator 100 to the vacuum chamber VC. A seal or bellow is required between the secondary vacuum chamber 210 and the connection member 200. In alternative illustrated in FIG. 9, the connection member 200 connects the balance mass BM to the elastic coupling 150 and the balance mass actuator 100 which are directly connected to the base frame BF. The vacuum chamber VC is separate from the base frame in this embodiment such that the balance mass actuator 100 does not need to be vacuum compliant as it is positioned outside of the vacuum. A seal is required between the vacuum chamber VC and the connection member 200.

Figure 10:
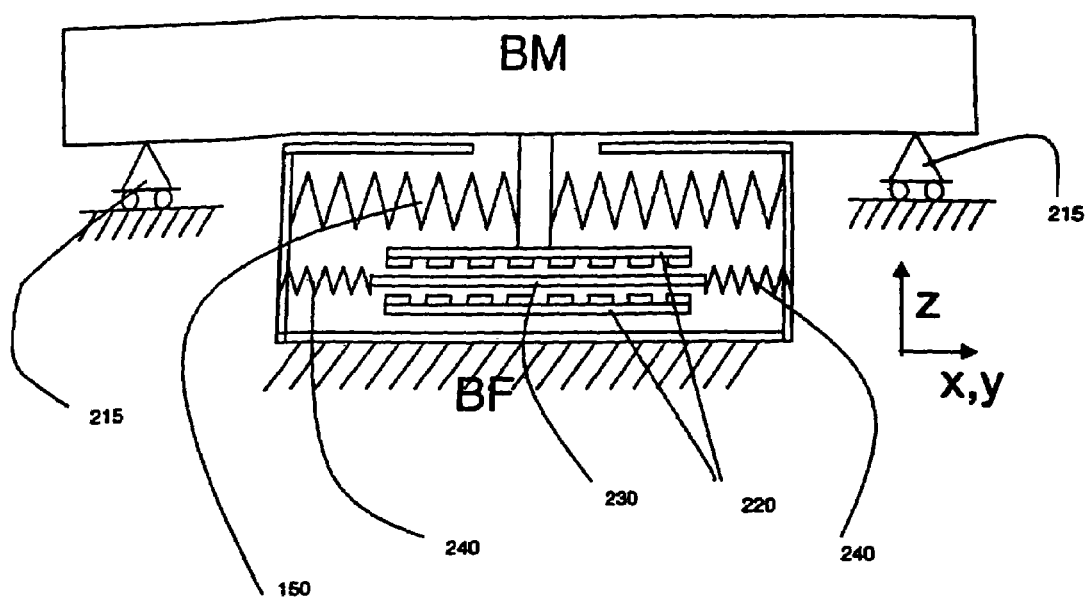
FIG. 10 schematically depicts a KDK-system comprising an Eddy current damper.

FIG. 10 schematically depicts a KDK-system connected between the balance mass BM and the base frame BF. The balance mass is supported by the bearing system 215. The KDK-system comprises an elastic coupling 150 and a spring-damper system comprising springs 240 and an Eddy current damper comprised of magnet plates 220 and a conducting plate 230 positioned between both magnet plates.

The balance mass BM can have 1 to 6 degrees of freedom, but may have 3 degrees of freedom (in the horizontal plane) or 6 degrees of freedom (both in the horizontal and vertical plane). The coupling as described by the present invention between balance mass and base frame is applicable in all degrees of freedom in which the substrate table or support has movements. The elastic coupling between balance mass and base frame may have different properties for the different degrees of freedom. The elastic coupling may further be combined with a balance mass actuator and/or a spring-damper system having different properties for the different degrees of freedom.

Figure 11:
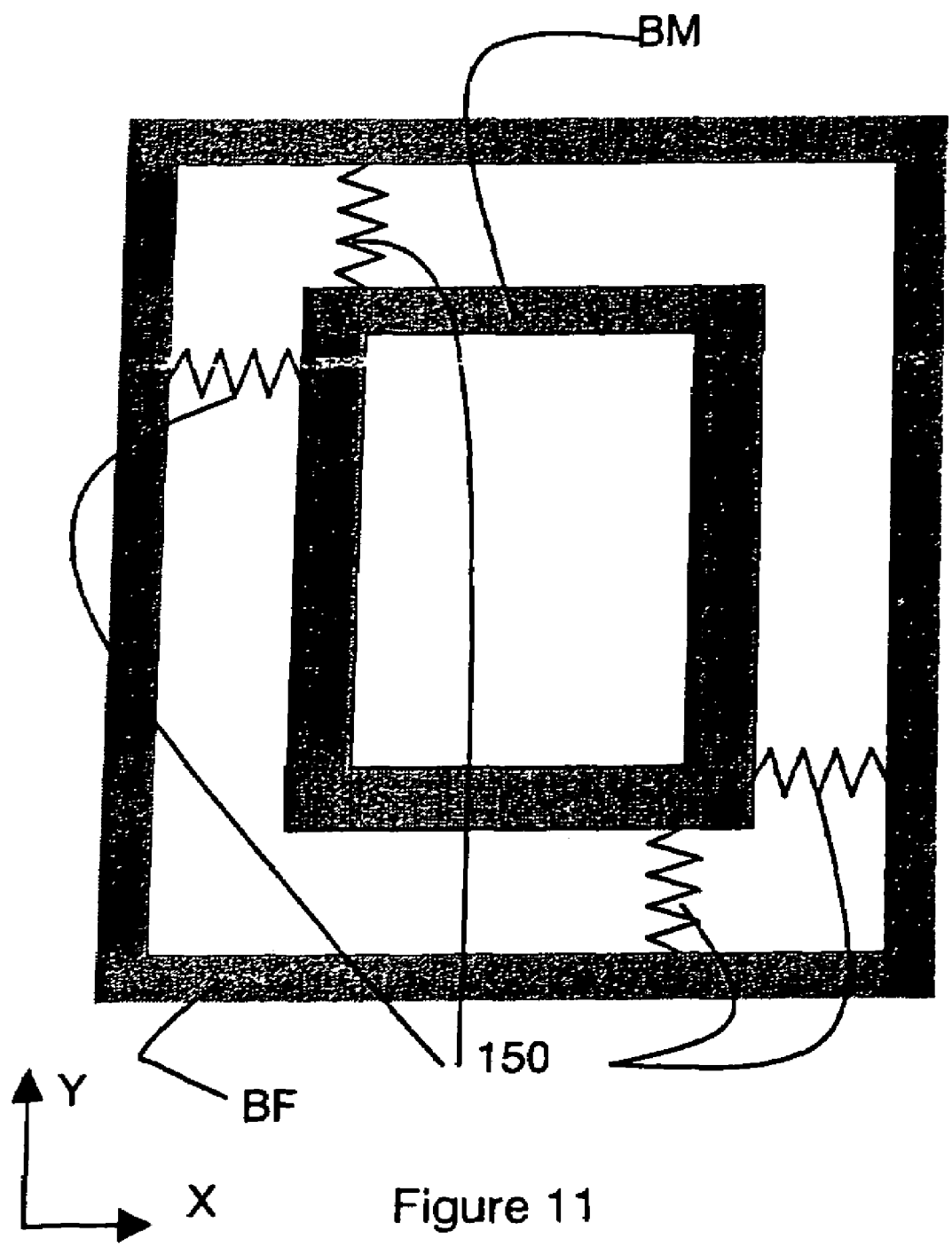
FIG. 11 schematically depicts a Balance mass that is coupled in 3 degrees of freedom in the horizontal plane.

As an example, FIG. 11 shows a top view of a possible arrangement wherein the elastic couplings 150 are springs between a balance mass BM and a base frame BF. It should be clear that the depicted elastic coupling may be combined with the KDK-system or combined with a damper and a balance mass actuator. It should also be noted that in this arrangement the Balance mass is coupled in 3 degrees of freedom (X,Y and Rz) although only springs in X and Y direction are applied. This method for defining the elastic coupling in different degrees of freedom can also be applied for more than 3 degrees of freedom.

While specific embodiments of the invention have been described above, it will be appreciated that the invention may be practiced otherwise than as described. The description is not intended to limit the invention.

What is claimed is:

1. A lithographic projection apparatus, comprising:
   a radiation system configured to provide a beam of radiation;
   a support configured to support a patterning device, the patterning device being configured to pattern the beam of radiation according to a desired pattern;
   a substrate table configured to hold a substrate;
   a projection system configured to project the patterned beam onto a target portion of the substrate;
   a base frame;
   a balance mass; and
   an actuator configured to actuate a force between the substrate table or the support and the balance mass thereby to position the substrate table or the support, wherein the balance mass is coupled to the base frame via an elastic coupling so that the balance mass has a suspension eigenfrequency of between 0.3 and 10 Hz such that a portion of a reaction force is exerted on the base frame.

2. An apparatus according to claim 1, the balance mass is supported by the base frame via a bearing.

3. An apparatus according to claim 1, wherein the apparatus is configured such that on movement during positioning of the substrate table or the support the position of a combined center of gravity of the substrate table or the support and the balance mass relative to the base frame also moves.

4. An apparatus according to one of claim 1, further comprising a balance mass actuator configured to control the position of the balance mass.

5. An apparatus according to claim 4, wherein the balance mass actuator is positioned in parallel with the elastic coupling and the balance mass is also coupled to the base frame via the balance mass actuator.

6. An apparatus according to claim 1, further comprising a spring-damper system positioned in parallel with the elastic coupling, wherein the balance mass is also coupled to the base frame via the spring damper system.

7. An apparatus according to claim 6, wherein the spring-damper system comprises at least one element having the characteristics of a spring connected in series with at least one element having the characteristic of a damper.

8. An apparatus according to claim 7, wherein the spring-damper system comprises an Eddy current damper.

9. An apparatus according to claim 4, wherein, in use, vibration of the balance mass due to the elastic coupling is actively damped by the balance mass actuator.

10. An apparatus according to of claim 1, wherein, in use, vibration of the balance mass generated due to the elastic coupling is damped with a damper with a damping coefficient of between 0.5 and 1.0.

11. An apparatus according to of claim 1, wherein, in use, vibration of the balance mass generated due to the elastic coupling is damped with a damper wit a damping coefficient of between 0.65 to 0.75.

12. An apparatus according to claim 10, wherein the damper is positioned in parallel with the elastic coupling and the balance mass is also coupled to the base frame via the damper.

13. An apparatus according to claim 9, wherein the balance mass is damped with a damping coefficient which is varied as a function of frequency.

14. An apparatus according to claim 4, further comprising a controller configured to control the balance mass actuator and periodically apply a position control loop substantially to prevent drift of the balance mass due to repetitive motions of the substrate table or the support.

15. An apparatus according to claim 1, wherein between 50 and 100% of the reaction force with a frequency below 3 to 10 Hz is exerted by the elastic coupling on the base frame.

16. An apparatus according to claim 1, wherein a bellows extends between the balance mass and the base frame.

17. An apparatus according to claim 1, further comprising a vacuum chamber containing the substrate table or the support and the balance mass.

18. An apparatus according to claim 17, wherein the base frame forms part of the wall portions of the vacuum chamber and a bellows extends between the balance mass and the wall portions.

19. An apparatus according to claim 16, wherein the bellows forms at least part of the elastic coupling.

20. An apparatus according to claim 18, wherein a balance mass actuator or a spring-damper system is connected with the balance mass through the bellows.

21. An apparatus according to claim 1, wherein the stiffness of the elastic coupling is a function of the relative position of the balance mass with respect to the base frame.

22. An apparatus according to claim 4, wherein the lithographic apparatus further comprises a feed forward controller configured to control the balance mass actuator.

23. An apparatus according to claim 1, wherein the elastic coupling is applied in at least 3 degrees of freedom to the balance mass.

24. A device manufacturing method, comprising:
patterning a beam of radiation with a patterning device supported on a support;
projecting the patterned beam of radiation onto a target portion of a layer of radiation- sensitive material at least partially covering a substrate on a substrate table positioned on a base frame;
actuating a force between the substrate table or the support and a balance mass thereby to position the substrate table or the support; and
transmitting part of the force to the base frame through an elastic coupling which couples the balance mass to the base frame with a suspension eigenfrequency of between 0.3 and 10 Hz.

* * * * *